United States Patent [19]

Anbe et al.

[11] 3,766,494

[45] Oct. 16, 1973

[54] RESONANCE-FREQUENCY VARIABLE RESONATOR

[75] Inventors: Toshi Anbe; Yukimichi Tokuzawa, Kadoma, Japan

[73] Assignee: Matsushita Electric Industrial Company, Kadoma City, Osaka, Japan

[22] Filed: May 19, 1971

[21] Appl. No.: 144,886

[30] Foreign Application Priority Data

May 21, 1970 Japan ............................ 45/44236

[52] U.S. Cl. ........................ 331/99, 330/21, 330/31, 331/117 D, 331/177 V, 333/82 B, 334/4, 334/15

[51] Int. Cl. .......................................... H03b 5/18

[58] Field of Search .................. 330/21, 31; 331/96, 331/99, 177 V, 117 D; 333/24.2, 73 S, 82 B, 84 M; 334/4, 15, 65; 336/30

[56] References Cited

UNITED STATES PATENTS 3,102,987 9/1963 Yasuda ................................ 334/4

FOREIGN PATENTS OR APPLICATIONS 1,100,751 1/1968 Great Britain ..................... 334/15

OTHER PUBLICATIONS

L. Lewin, "A Resonance Absorption Isolator In Microstrip For 4 GC/S," The IEE, Part B Supplement, Convention on Ferrites, Oct.–Nov. 1956

*Primary Examiner*—Paul L. Gensler
*Attorney*—John Lezdey

[57] ABSTRACT

A resonance frequency variable resonator is provided, which comprises a ferrite strip line having a ferrite chip, and a varactor diode electrically connected to the ferrite strip line. Each of the reactances of the ferrite strip line and the varactor diode is controlled by a magnetic field and a bias voltage applied thereto so as to establish the resonance frequency of the resonator as desired. Since the ferrite strip line and the varactor diode complement each other, the resonator has many excellent properties, high speed responsiveness, wide variation range, reliability, and so on.

8 Claims, 4 Drawing Figures

INVENTORS:
TOSHI ANBE + YUKIMICHI TOKUZAWA
BY
John Lezdey
ATTORNEY

INVENTOR

TOSHI ANBE & YUKIMICHI TOKUZAWA

BY

John Lezdey

ATTORNEY

RESONANCE-FREQUENCY VARIABLE RESONATOR

This invention relates to a resonator and more particularly relates to a resonance-frequency variable resonator including solid variable reactance devices.

Various resonance-frequency variable resonators are known in the art, one of which is a resonator using a variable capacitor having mechanically movable pairs of electrodes. This type of capacitor is presently considered rather obsolete and is practically unusable for automatically controlled resonators. Another type of resonator is the one using a varactor diode having a variable capacitance formed in a depletion layer thereof. This resonator is advantageous for its high speed responsiveness, controllability, and so on. A problem is still encountered in incorporating a plurality of resonators of this type in a single system such as a super-heterodyne radio receiver and a multi-stage tuned amplifier, because it is difficult to have available those varactor diodes which possess capacitance variation characteristics coinciding with one another.

It is therefore an object of this invention to provide an improved resonance-frequency variable resonator including a varactor diode and a ferrite strip line element which is free from such drawback as abovementioned.

Another object of this invention is to provide a resonator the resonance-frequency of which is varied by two parameters.

Further object of this invention is to provide a resonator having a wide resonance-frequency variation range.

Still further object of this invention is to provide a resonator having an easily controllable reactance.

Further object of this invention is to provide a resonance-frequency variable resonator with high reliability and stability.

Still further object of this invention is to provide a resonance-frequency variable resonator usable for UHF range.

Further object of this invention is to provide a resonance-frequency variable resonator which can be readily rendered to a solid state.

Still further object of this invention is to provide a resonance-frequency variable resonator useful for a local oscillator of a super-heterodyne receiver.

Further object of this invention is to provide a resonance-frequency variable resonator useful for a multistage tuned amplifier.

The resonator of this invention includes a ferrite strip line element and a varactor diode which complement each other.

Figure 1:
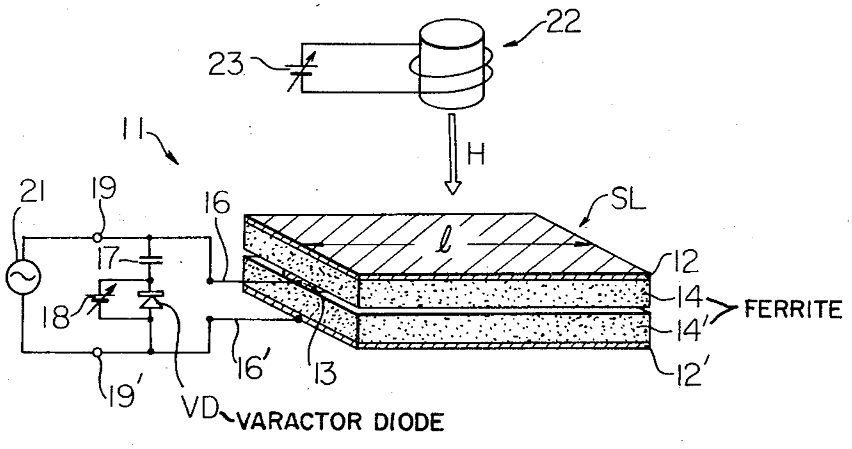
FIG. 1 is a perspective view of a resonator according to this invention.

A preferred embodiment of the resonator of this nature, generally indicated by 11 in FIG. 1, comprises a ferrite strip line element SL including a strip line structure constituted by a pair of outer conductors 12 and 12′ and an inner conductor 13 positioned between and spaced apart from the conductors 12 and 12′, and a pair of ferrite plates 14 and 14′ interposed as insulators between the inner conductor 13 and the outer conductors 12 and 12′. Although the ferrite plates 14 and 14′ are herein shown as spaced apart, they may preferably be in contact with each other with the inner conductor 13 sandwiched therebetween. The outer conductors 12 and 12′ are electrically connected to each other so as to have a common electrical potential. If desired, either of the outer conductors 12 and 12′ may be removed to provide ease of production which will be more or less offset by a degraded performance efficiency. An end of the inner conductor 13 is connected through a line 16 and a capacitor 17 to a cathode terminal of a varactor diode VD. This varactor diode has an anode terminal connected through a line 16′ to that portion of the conductor 12 or 12′ which is nearest the above-mentioned end of the inner conductor 13. A variable voltage d.c. power source 18 has positive and negative terminals which are connected to the anode and cathode terminals of the varactor diode VD, respectively. The lines 16 and 16′ are also connected to input terminals 19 and 19′ through which an a.c. signal from an a.c. signal source 21 are applied. The varactor diode VD is reversely biased by the d.c. power source 18 and the capacitance C of the varactor diode VD is varied in proportion to the variation of the d.c. voltage from source 18. On the other hand, a magnetic field H is applied to the ferrite strip line SL as indicated by an arrow H. This magnetic field is produced by a solenoid 22 having a core energized by a variable voltage d.c. power source 23. An effective permeability of each of the ferrite plates 14 and 14′ is varied in accordance with the variation of an intensity of the magnetic field H. The intensity of the magnetic field H lies within a magnetic-resonance region of 1,000 to 3,000 gauss for instance in order to attain a steep variation of the effective permeability in terms of the variation of the magnetic field. A ferrite material making up the ferrite plates should have as high rate as possible of change of effective permeability within the magnetic-resonance region. In this embodiment, the outer conductors 12 and 12′ are connected direct to the inner conductor 13 at their ends opposite to the lines 16 and 16′. A modified configuration may be put into practice for separating the reverse biasing voltage source and the strip line structure of the strip line element SL from each other. For example, the capacitor 17 can be interposed in the line 16 and the source 18 and the signal source 21 positioned in series with each other.

Figure 2:
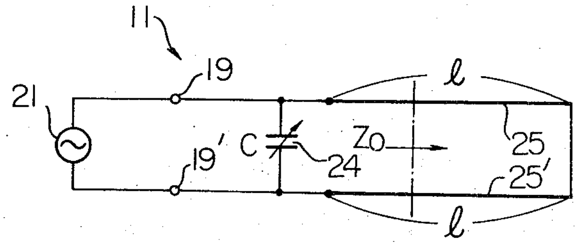
FIG. 2 is a diagram showing an equivalent circuit of the resonator of FIG. 1.

In this instance, if the length of outer conductors 12 and 12′ is given by $l$, the resonator of FIG. 1 is diagrammatically shown by an equivalent circuit 11 of FIG. 2. A variable capacitor 24 having a capacitance C corresponds to the varactor diode VD, and a pair of lines 25 and 25′ of the length $l$ represent the ferrite strip line elements SL. The characteristic impedance $Zo$ of the lines 25 and 25′ is given by $\sqrt{\mu/\epsilon}$, where $\mu$ and $\epsilon$, respectively represent the effective permeability and the dielectric constant of the ferrite plates 14 and 14′.

Here, since the resistance and conductance of the ferrite strip line element SL are so small as to be negligible, the reactance of the ferrite strip line element SL is given by $Zo\cdot\tan\beta l$. Hence, an angular velocity $\omega$ of a resonance frequency of the resonator 11 is defined by $$\omega \cdot C \cdot Zo \cdot \tan\beta l = 1 \qquad (1)$$

where $\beta = \omega\sqrt{\epsilon\mu}$
From above equation (1), it is apparent that the variation of the resonance frequency of the resonator 11 of FIG. 1 is effected by varying either the magnetic field H or the bias voltage of the source 18.

If an a.c. signal having a wavelength $\lambda$ the range of which is defined by $\lambda/8 \geqq l$ is applied to the resonator 11, the following equation will hold.

$$\tan\beta l \simeq \beta l = \omega\sqrt{\mu\epsilon} \cdot l$$

Then, the equation (1) can be translated into $$\omega^2 \cdot C \cdot \mu \cdot l = 1 \qquad (2)$$

Hence, $\omega \alpha \mu^{-1/2}$ (3)

or $\omega \alpha\ C^{-1/2}$ (4)

From above expressions (3) and (4), it is evident that both the capacitance $C$ and the permeability $\mu$ define the resonance frequency of the resonator 11 substantially independently of each other, as far as the wavelength $\lambda$ is localized in a region defined by $\lambda/8 \geqq l$.

In this instance, it should be noted that, since the angular velocity $\omega$ should be real, $\tan\beta l$ is larger than 0. The length $l$ is thus expressed as $$n\lambda/2 < l < (2n+1)\ \lambda/4 \qquad (5)$$

where $n = 0, 1, 2, ...$

Although the inner and outer conductor herein shown as electrically connected at one end thereof to each other in the present embodiment, a ferrite strip line element which is modified to have its inner and outer conductors isolated from each other may be used by preference. In this case, the characteristic reactance is given by $Zo \cdot \cot\beta l$, and the equation (1) can be replaced by $$\omega^2 \cdot C \cdot Zo \cdot \cot\beta l = 1 \qquad (1)'$$

Similarly, the length $l$ is given by $$(2n+1)\ \lambda/4 < l < (n+1)\ \lambda/2 \qquad (5)'$$

where $n = 0, 1, 2, ...$

Comparison between the expressions (5) and (5)' will suggest that the former ferrite strip line element having short-circuited outer and inner conductors is advantageous over the latter for its compactness.

Figure 3:
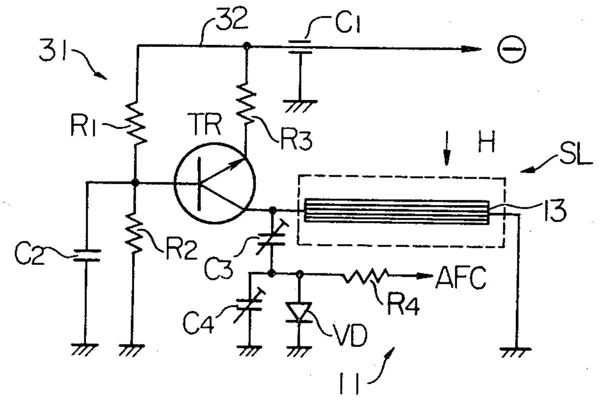
FIG. 3 is a diagram showing an oscillator using a modification of the resonator of this invention.

Referring to FIG. 3, a modified form of the resonator of this invention is shown as employed for a local oscillator 31 cooperating with a frequency converter of a superheterodyne radio receiver. This oscillator includes a transistor TR having a base connected through a resistor $R_1$ to a negative bus line 32 which is connected through a feed-through capacitor $C_1$ to a negative terminal of a d.c. power source (not shown). The base of this transistor is grounded through a resistor $R_2$ by-passed by a capacitor $C_2$. The transistor TR has its emitter connected through a resistor $R_3$ to the negative bus line 32 and its collector connected to one end of an inner conductor of a strip line element SL the other end of which is connected direct to outer conductors and is also grounded. A suitable magnetic field H is applied to the strip line element SL. The collector is also connected to a trimmer capacitor or adjustable capacitor $C_3$ which is in turn connected to an anode terminal of a varactor diode VD shunted by a trimmer capacitor $C_4$. A cathode terminal of the varactor diode VD is grounded.

To the anode terminal of the varactor diode VD is applied an AFC (automatic frequency control) voltage from an after-stage such as an intermediate frequency amplifier through a resistor $R_4$. In a normal condition, the AFC voltage is fixed at a predetermined level and the oscillator 31 oscillates at a resonance frequency of the resonator 11 defined by the given magnetic field and the AFC voltage. In this instance, it should be noted that a frequency of a signal from a broadcasting station is liable to deviate from the central frequency thereby to affect the performance quality of the radio receiver. The AFC voltage is adapted to deviate from the predetermined level in proportion to the deviation of the frequency of the received signal through such as an antenna. Therefore, the capacitance of the varactor diode VD is varied in proportion to the deviation of the frequency of the received signal. As a result, the resonance frequency of the resonator 11, that is, the oscillation frequency of the oscillator 31, is adjusted. This adjustment is quickly accomplished by the high speed responsiveness of the varactor diode VD even when the frequency of the received signal deviates at a high speed.

It is noteworthy that the local oscillator 31 is capable of providing a wide frequency range since the variable range of the reactance of the ferrite strip line can be established to be wider than that of the varactor diode. In addition, the effective permeability $\mu$ of the ferrite chip is easily controlled during production so that it is easy to obtain those ferrite chips which have a common permeability and which are convenient for the tracking operation between the local oscillator and a tuner (not shown). It should be now understood that the transistor TR may be replaced by another active element such as a vacuum tube.

Figure 4:
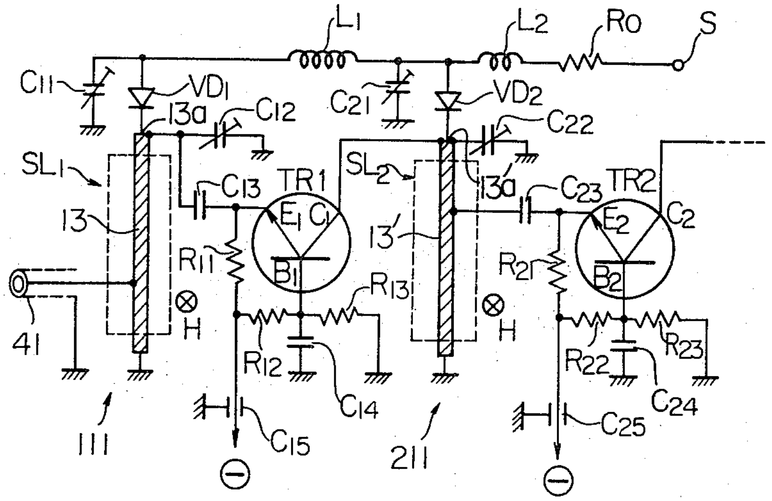
FIG. 4 is a diagram showing a two-stage tuned amplifier using another modification of the resonator.

Another modified form of the resonator according to this invention is shown in FIG. 4 as combined with a twostage tuned amplifier including transistors $TR_1$ and $TR_2$. An input line 41 such as an inner conductor of a coaxial line is provided, which is connected to an intermediate point of inner conductor 13 of a strip line $SL_1$. The inner conductor 13 is grounded at one terminal and connected at the other to a cathode terminal of a varactor diode $VD_1$ and through a coupling capacitor $C_{13}$ to an emitter of the transistor $TR_1$. This emitter is connected to a negative d.c. source through a resistor $R_{11}$ and a feed-through capacitor $C_{15}$. A bias potential at a base $B_1$ of the transistor $TR_1$ is established by a resistor $R_{12}$ and a resistor $R_{13}$ one terminal of which is grounded. The other terminal of the resistor $R_{13}$ is connected to the base $B_1$ of the transistor $TR_1$ and one terminal of the resistor $R_{12}$ which is connected at the other terminal to the negative source. A by-pass capacitor $C_{14}$ is connected to the base $B_1$ which is grounded so as to pass a signal component therethrough. A collector $C_1$ of the transistor $TR_1$ is connected to one end of an inner conductor 13' of a second strip line element $SL_2$ of a second stage.

Adjustable capacitors $C_{11}$ and $C_{12}$ are provided in order to supplement the varactor diode $VD_1$. One terminal of the capacitor $C_{11}$ is connected to the anode of the varactor diode $VD_1$ and the other terminal is grounded. One terminal of the capacitor $C_{12}$ is connected to the cathode of the varactor diode and the other terminal is grounded.

One terminal of the inner conductor 13' is grounded and the other end is connected to a second varactor $VD_2$. To a suitable intermediate point of the inner conductor 13' is connected an emitter $E_2$ of the transistor $TR_2$ through a coupling capacitor $C_{23}$. The emitter $E_2$ is connected through a resistor $R_{21}$ and a feed-through capacitor $C_{25}$ to a negative bias d.c. source. A potential of a base $B_2$ of the transistor $TR_2$ is established by resistors $R_{22}$ and $R_{23}$. One terminal of the resistor $R_{22}$ is connected to the negative bias source through the feed-through capacitor $C_{25}$ and the other terminal is connected to the base $B_2$ and to one terminal of the resistor $R_{23}$ the other terminal of which is grounded. A by-pass capacitor $C_{24}$ is connected to the base $B_2$ which is grounded so as to pass a signal component therethrough. A collector $C_2$ of the transistor $TR_2$ is connected to a succeeding stage (not shown). Adjustable capacitors $C_{21}$ and $C_{22}$ are provided in order to supplement the varactor diode $VD_2$. One terminal of the capacitor $C_{21}$ is connected to an anode of the varactor diode $VD_2$ and the other terminal is grounded. One terminal of the capacitor $C_{22}$ is connected to the cathode terminal of the varactor diode $VD_2$ and the other terminal of the capacitor $C_{22}$ is grounded. A stepwise varied negative d.c. voltage is applied to the respective anode terminals of the varactor diodes $VD_1$ and $VD_2$ through a terminal S, a resistor $R_O$, and inductors $L_1$ and $L_2$ to bias the varactors $VD_1$ and $VD_2$. The ferrite strip line elements $SL_1$ and $SL_2$ are on the other hand, subject to a common magnetic field H.

When in operation, a plurality of high frequency signals are applied through the input line 41 to the strip line $SL_1$. The input signals having the same frequency as the resonance frequency of the resonator 111 constituted by the strip line $SL_1$ and the varactor diode $VD_1$ are selectively transmitted one by one to the one end 13*a*. This signal is applied through the coupling capacitor to the emitter $E_1$ and then amplified by the transistor $TR_1$. The amplified signal is applied to the one end 13'*a* of the strip line 13'. After filtered by the resonator 211 constituted by the strip line $SL_2$ and the varactor diode $VD_2$, the signal is applied through the coupling capacitor $C_{23}$ to the emitter $E_2$ and then amplified by the transistor $TR_2$. The thus amplified signal is transmitted to the succeeding stage through the collector $C_2$.

On the other hand, the magnetic field H which is applied to the strip line elements $SL_1$ and $SL_2$ and the voltage through the terminal S is regulated, respectively, so as to establish the respective resonance frequencies of the resonators 111 and 211. The transistors TR1 and TR2 may be replaced by other active elements such as vacuum tubes.

This amplifier finds especially advantageous applications in a receiver for wireless communication to selectively receive one of carrier waves corresponding to a channel localized within a certain band. In such case, the magnetic field H is firstly adjusted to select a band within which a plurality of carrier channels are localized. The voltage through the terminal S is secondly selected to select one of the carrier waves localized within the band firstly selected. If further regulation of the resonance frequency is required, the magnetic field H may be regulated.

It is now appeared that, since the resonator of this invention dispenses with mechanical moving elements and is constructed in a simple manner, it not only offers a high reliability but is ready for commercial production.

What is claimed is:

1. A resonance-frequency variable resonator comprising: a ferrite strip line element including an inner conductive plate, at least one outer conductive plate facing said inner conductive plate, and at least one ferrite plate positioned between said inner and outer conductive plates said ferrite line element being subjected to a magnetic field; a varactor diode having anode and cathode terminals which are connected to said inner and outer conductive plate; and biasing source means for applying a reverse bias to said varactor diode.

2. A resonator according to claim 1, wherein said anode and cathode terminals are respectively connected to ends of said inner and outer conductive plates through at least one capacitor, and said inner and outer conductive plates are connected to each other at the opposite ends thereof.

3. A resonator according to claim 1, wherein said magnetic field is varied within a region of magnetic resonance of said ferrite plate.

4. A resonator according to claim 1, comprising a pair of outer conductive plates which are connected to each other for having a common electric potential.

5. A resonator according to claim 1, further comprising a supplemental capacitor parallel with said varactor diode.

6. A resonance-frequency variable resonator, in combination with an oscillator including an active element, which resonator comprises a ferrite strip line element including an inner conductive plate which is grounded at one end and adapted to be connected at the opposite end to said active element, at least one outer conductive plate which is grounded at both ends, and at least one ferrite plate positioned between said inner and outer conductive plates and subjected to a variable magnetic field; a varactor diode having an anode which is connected through a capacitor to said opposite end of said inner conductive plate and to a negative variable voltage source, and a cathode terminal which is grounded.

7. A resonator according to claim 6, wherein said varactor diode is shunted by a supplemental capacitor.

8. A resonance-frequency variable resonator in combination with a tuned amplifier including at least one active element, which resonator comprises a ferrite strip line element including an inner conductive plate which is grounded at one end and adapted to be connected at the opposite end to said active element through a coupling capacitor, the intermediate portion of said inner conductive plate being connected to an input line, at least one outer conductive plate grounded at both ends, and at least one ferrite plate positioned between said outer and inner conductive plates and subjected to a variable magnetic field; and a varactor diode having a cathode which is connected to said opposite end of said inner conductive plate and an anode which is connected to a negative variable d.c. voltage source.

* * * * *